(12) United States Patent
Martens et al.

(10) Patent No.: US 6,618,629 B2
(45) Date of Patent: Sep. 9, 2003

(54) COMMUNICATIONS INTERFACE FOR ASSEMBLY-LINE MONITORING AND CONTROL

(75) Inventors: Eric A. Martens, Derry, NH (US); Peter P. Neihardt, Boxford, MA (US); Michael W. Hamblin, Stowe, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/047,342

(22) Filed: Jan. 15, 2002

(65) Prior Publication Data

US 2003/0135296 A1 Jul. 17, 2003

(51) Int. Cl.[7] ................................................. H05K 3/02
(52) U.S. Cl. ........................... 700/9; 700/95; 700/3; 29/846; 702/117; 714/25
(58) Field of Search ...................... 700/9, 95, 3; 29/846; 702/117; 714/25

(56) References Cited

U.S. PATENT DOCUMENTS 5,628,112 A * 5/1997 Maslar et al. ............... 29/846
2003/0053677 A1 * 3/2003 DeYoung et al. ........... 382/149

* cited by examiner

*Primary Examiner*—Leo Picard
*Assistant Examiner*—Michael D. Masinick
(74) *Attorney, Agent, or Firm*—Cesari and McKenna LLC

(57) ABSTRACT

A circuit-board-processing line (10) employing various circuit-board-processing machines (12, 14, 16, 18, 62, 64, and 66) includes SMEMA-device emulators (22 and 68) interposed in the SMEMA channels between successive board-processing machines. Coordination circuitry (24) receives from those emulators reports of the signals that they observe, and it controls various line machinery and other emulators in response. It similarly controls the emulators in response to information that it receives from various board-processing machines. In this way, the system is able to provide reporting and control features that the board-processing machines do not provide inherently.

36 Claims, 4 Drawing Sheets

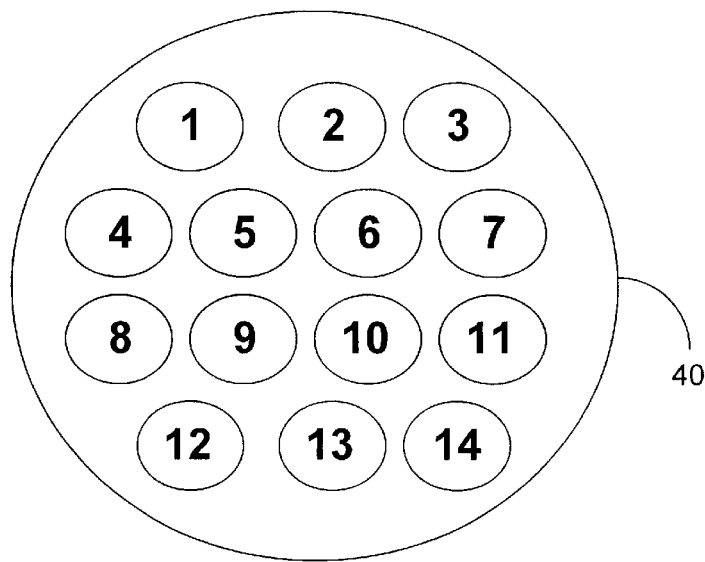
FIG. 2
```
<CONTROL>
    <COMMAND_TYPE>END</ COMMAND_TYPE>
</CONTROL>
```
FIG. 6
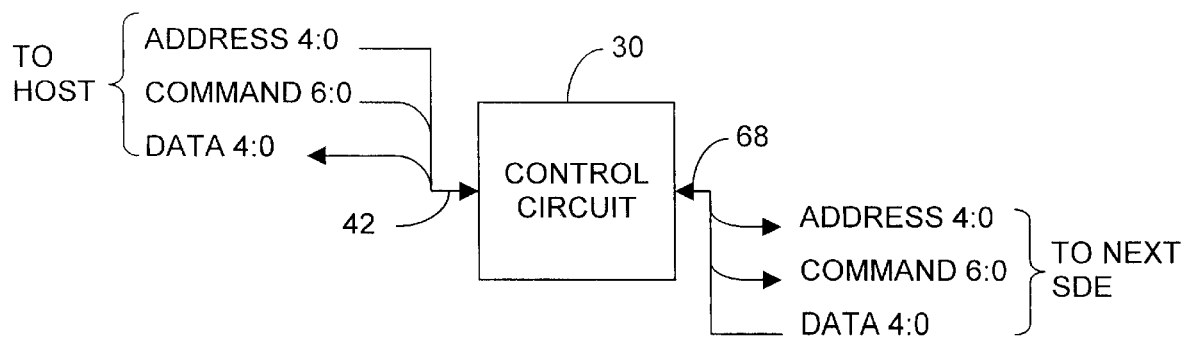
FIG. 4

```
<UNITCOMPLETE>
    <UID>unique_unit_id</UID>
    <WID>unique_wip_id</WID>
    <RID>resource_id</RID>
    <TIME Id='START'>time_stamp</TIME>
    <TIME Id='FINISH'>time_stamp</TIME>
    <CYCLETIME>cycle_time </CYCLETIME>
    <RESULT>result_map</RESULT>
    <LOOPCOUNT>process_loop_count</LOOPCOUNT>
    <RERUNCOUNT>process_rerun_count</RERUNCOUNT>
    <PID>product_id</PID>
    [<CID>customer_id</CID>]
    [<WOID>work_order_id</WOID>]
    [<PROGID>program_id</PROGID>]
    [<SUBASSEMLIST>
        {<SUBASSEM>
            <SN>serial_number_string</SN>
            [<UID>unique_unit_id</UID>]
            [<PID>product_id</PID>]
        </SUBASSEM>}
    </SUBASSEMLIST>]
    [<NONCONFORMANCE>
        {<SYMPTOM [CIR='circuit_number']>
            <LABEL>label_string</LABEL>
            <TYPE>type_code</TYPE>
            <MSG>failure_message_string</MSG>
        </SYMPTOM>}
        {<DEFECT [CIR='circuit_number']>
            <LABEL>label_string</LABEL>
            <DCODE>defect_code</DCODE>
            <DLOC>defect_location</DLOC>
            [<MSG>defect_description_string</MSG>]
        </DEFECT>}
        {<REPAIR[CIR='circuit_number']>
            <DCODE>defect_code</DCODE>
            <DLOC>defect_location</DLOC>
            <RCODE>repair_code</RCODE>
            <RLOC>repair_location</RLOC>
            [<MSG>repair_description_string</MSG>]
        </REPAIR>}
        {<CORRECTIVEACTION [CIR='circuit_number']>
            <DCODE>defect_code</DCode>
            <DLOC>defect_location</DLOC>
            <ACODE>corrective_action_code</ACODE>
            [<MSG>action_description_string</MSG>]
        </CORRECTIVEACTION>}
    </NONCONFORMANCE>]
</UNITCOMPLETE>
```

FIG. 5

COMMUNICATIONS INTERFACE FOR ASSEMBLY-LINE MONITORING AND CONTROL

BACKGROUND OF THE INVENTION

1. Field of the Invention

The present invention is directed to circuit-board-processing lines and in particular to controlling their operation.

2. Background Information

Circuit-board manufacture typically involves using a sequence of disparate machinery to perform successive operations on the same circuit boards. A board-processing line may include machines for depositing solder paste onto the boards, for placing components on them, for performing visual inspections of the boards thus populated by components, for causing solder to reflow and thereby establish electrical connections among the components, and for performing electrical tests on the resultant boards. It is desirable, of course, for all of these and other types of circuit-board-processing machines to cooperate in such a manner as to make the overall assembly process as automatic and efficient as possible. But overall control is complicated by the fact that different machines on the same line will typically have been made by different manufacturers. The capabilities for automatic control that the different line-machinery manufacturers provide tend not to have been selected with a common overall-control scheme in mind.

True, manufacturers have arrived at some standardization for rudimentary communication between successive machines so that they can "know" when the previous machine is ready to supply a new board and when the next machine is ready to receive one. The Surface Mount Equipment Manufacturers Association ("SMEMA") Interface Standard specifies the physical arrangement of an electrical interface between successive circuit-board-processing machinery and further specifies the meaning to be assigned to different states of that interface. (We note at this point that, although the first two letters in SMEMA stand for "surface mount," the SMEMA standard's adoption has not been limited to machines that handle boards populated with surface-mount components.)

For an upstream machine to inform the downstream machine that the upstream machine is ready to supply another board, for instance, the SMEMA standard specifies that the upstream machine should send a "board available" signal by shorting together two specified conductors in the SMEMA interface. And, to determine whether the downstream device is ready to receive the next board, the upstream device senses whether the downstream device has sent a "machine ready" signal by shorting together two other specified conductors. By conforming to this standard, circuit-board-processing machinery from different manufacturers can to an extent coordinate workflow along a manufacturing line.

But providing a higher level of control is more complex. For example, an inspection station at one point along the line may detect defects to which a high-level line-coordination system might best respond to by affecting the operation of, say, a pick-and-place machine located several positions upstream of the inspection station. But that pick-and-place machine may not provide an appropriate electrical interface by which it can be commanded to respond in the desired fashion. So the board manufacturer is forced either to make custom modifications to its machines so that they have the needed capabilities or to do without as great a degree of higher-level control as would be preferable.

SUMMARY OF THE INVENTION

We have recognized, though, that a significant amount of the additional desired capability can be provided by interposing in the SMEMA channel between successive machines a SMEMA-device emulator, i.e., an apparatus that receives and transmits the SMEMA signals without necessarily performing any associated board processing. That is, a SMEMA-device emulator will typically send and receive the SMEMA-defined "board-available" and "machine-ready" signals without actually presenting a circuit board or having a state in which it can in some sense process one. But such emulators appear as the upstream and downstream machines to the downstream and upstream machines, respectively, so that, say, the downstream circuit-board-processing machine can be sent a signal different from the signal that the upstream circuit-board-processing machine is actually sending.

Such emulators, often referred to as "break-out boxes," have frequently been used in the past for manual intervention in circuit-board-processing lines. But we provide the emulators with ports for non-SMEMA communications channels by which communication with coordination circuitry can occur. The coordination circuitry can thereby use an emulator to control the SMEMA-channel signals in response to signals that the coordination circuitry receives from other line machinery or from one or more other SMEMA-device emulators. The coordination circuitry can also control line machinery in response to SMEMA-channel signals that an emulator has sensed and reported to it over the non-SMEMA communications channel. As will be explained by example below, this provides ways of expanding a board-processing line's control capabilities without making custom modifications to the line's component machines.

BRIEF DESCRIPTION OF THE DRAWINGS

The invention description below refers to the accompanying drawings, of which:

FIG. 2 is a diagram illustrating the conductor arrangement in a SMEMA cable;

FIG. 4 is a diagram showing the conductor organization in the SMEMA-device emulator's non-SMEMA-channel;

FIG. 5 is a format diagram of a type of XML message employed within the coordination circuitry shown in FIG. 1; and FIG. 6 is a listing of another type of XML message that the coordination circuitry employs.

DETAILED DESCRIPTION OF AN ILLUSTRATIVE EMBODIMENT

Figure 1:
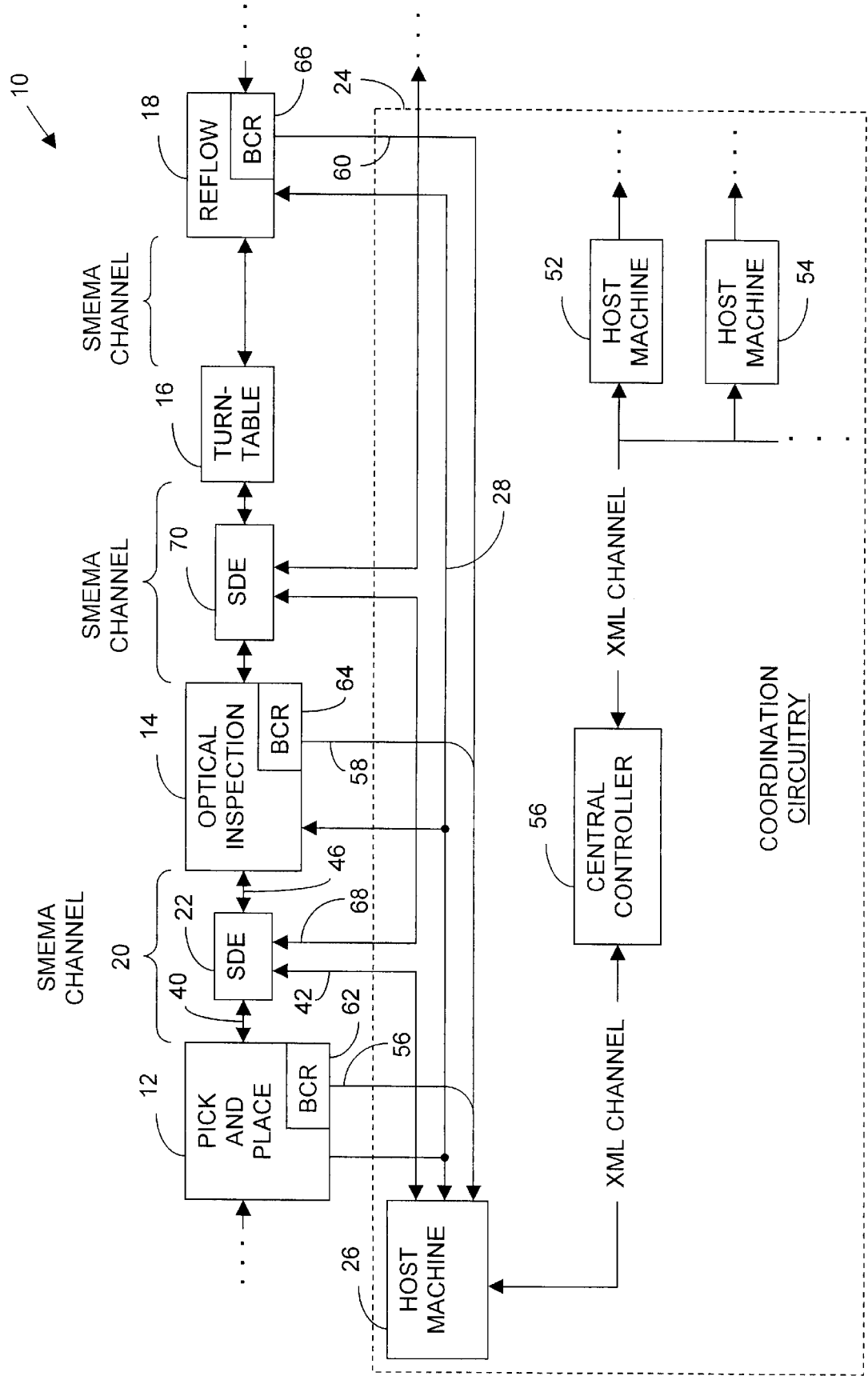
FIG. 1 is a block diagram of a circuit-board-processing line having SMEMA channels into which SMEMA-device emulators are interposed in accordance with the present invention's teachings.

FIG. 1 depicts a block-diagram of part of a typical circuit-board-processing line that employs the present invention's teachings. Blocks 12, 14, 16, and 18 represent the communications aspects of various circuit-board-processing machinery connected in series to process circuit boards sequentially. For the sake of example, FIG. 1 indicates that various initial processing steps are followed by a step in which a pick-and-place machine 12 places electrical components onto the circuit board. When the pick-and-place machine has finished populating a board, it employs a SMEMA channel 20 to signal this fact to a subsequent machine, such as an optical-inspection station 14.

As FIG. 2 shows, a SMEMA channel typically is electrically provided as a fourteen-conductor cable. The first two conductors provide a differential signal that indicates whether the downstream machine is ready to receive a new board, while the third and fourth conductors provide a differential signal that indicates whether the upstream machine has a board available to send the downstream machine. The standard leaves the fifth through seventh conductors available for user definition, specifies that the eighth is to be used as a shield conductor, and reserves the ninth through fourteenth for further standard definition. In ways familiar to those skilled in this art, adjacent machines thereby so coordinate the operations of their respective conveyors as properly to transfer a board from one machine to the next.

According to the invention, a SMEMA-device emulator, represented in FIG. 1 by block 22, is interposed in at least one of the SMEMA channels. Its purpose will be described presently, but we will initially consider it simply to be transparent so that the pick-and-place machine communicates directly over SMEMA channel 20 with, for example, an optical-inspection station 14.

Another example of circuit-board-processing machine is a turntable, which block 16 represents. This machine typically forwards boards from the optical-inspection station 14 to a solder-reflow machine 18, but it can be operated to divert boards that it receives from the optical-inspection station 14 to some other location, not shown, where boards containing defectively placed components can be repaired or dealt with in some other manner.

In addition to providing SMEMA ports, various board-processing machines will provide further communications interfaces by which they can report to or be remotely controlled by some coordination circuitry 24. That circuitry will be largely digital and usually computer-implemented. In many instances it will implemented in a single computer appropriately programmed for that purpose. For the sake of example, though, FIG. 1 depicts it as including more than one. In the illustrated embodiment, one is a host machine 26, typically a personal computer, that communicates by way of an Ethernet channel 28 with machines 12, 14, and 18. Of course, coordination circuitry in other embodiments of the invention may employ other media for communication with such machines; wireless communication, for instance, may be preferable in many contexts.

But some machines, such as turntable 16, may provide no direct communication at all with the coordination circuitry. Moreover, even machines that do include a non-SMEMA port for reporting and/or control may not have features adequate for the types of coordination that the user desires. As will become apparent in due course, the present invention therefore employs SMEMA-device emulators such as emulator 22 to enhance the system's control and communications capabilities without, in many cases, making any modifications to the SMEMA-enabled circuit-board-processing machinery.

Figure 3:
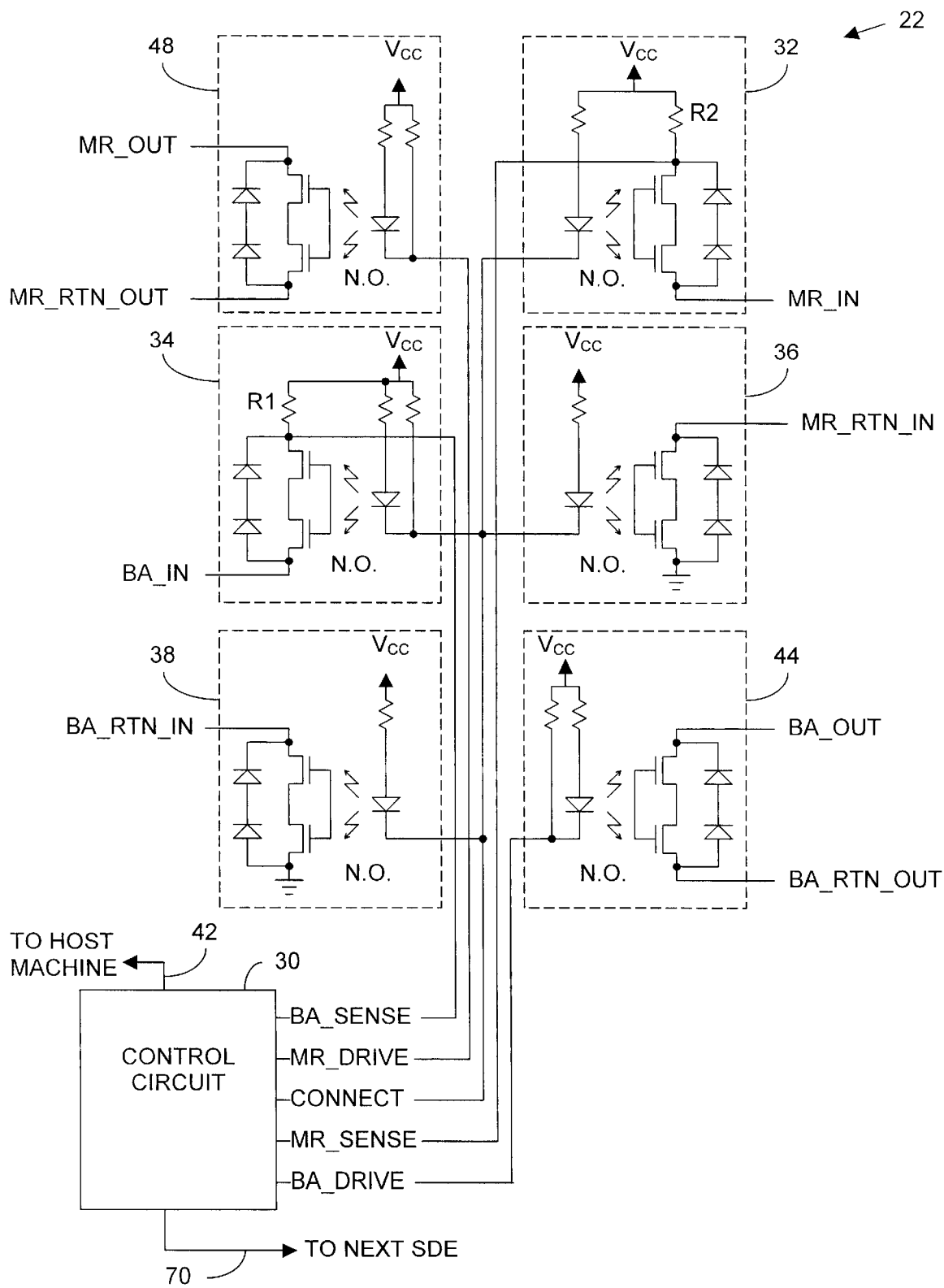
FIG. 3 is a simplified schematic diagram of a SMEMA-device emulator that can be used to implement the present invention's teachings.

FIG. 3 depicts in a simplified fashion one type of emulator that can be employed to practice the present invention's teachings. In normal operation, a control circuit 30 keeps normally open electronic relays 32, 34, 36, and 38 closed by asserting a CONNECT signal. With relays 34 and 38 thus closed, SMEMA signal line BA_RTN_IN is grounded, and SMEMA signal line BA_IN is connected through a load resistor to the circuit's source voltage.

If we assume that the emulator of FIG. 3 is FIG. 1's emulator 22, these signal lines are the first two conductors in the SMEMA cable 40 that connects emulator 22 to the pick-and-place machine 12. To indicate that it has a board available, that machine will connect BA_IN to BA_RTN_IN by closing a relay of its own. This will result in current flow through FIG. 3's load resistor R1 so that the control circuit 30 will receive a low BA_SENSE signal. By way of a non-SMEMA communications channel 42, the control circuit 30 receives from the host machine 26 signals that may, among other things, request that emulator 22 report the state of the SMEMA signals it receives. If the host machine does make such a request, the control circuit 30 will send the requested information over communications channel 42, as will be described below in more detail.

The host machine may also have commanded emulator 22's control circuit 30 to assume a state in which it forwards to the optical-inspection station 14 a board-available indication the same as the one, BA_IN, that the emulator receives from the pick-and-place machine 12. If BA_IN and therefore BA_SENSE are low when the control circuit 30 is in that state, circuit 30 will assert BA_DRIVE and thereby close a further relay 44, which shorts line BA_OUT to line BA_RTN_OUT. These are signal lines in FIG. 1's SMEMA cable 46 extending between emulator 22 and the downstream machine, optical-inspection station 14, which is thereby informed that a board is available. If BA_IN and BA_SENSE are high, on the other hand, the control circuit 30 does not assert BA_DRIVE, relay 44 remains open, and station 14 concludes that no board is available.

The third conductor in FIG. 1's downstream SMEMA cable 46 is FIG. 3's MR_IN line, which closed relay 32 connects to another signal line that the control circuit 30 monitors, namely, the MR_SENSE line. To indicate that it is ready to receive another board, the downstream machine, in this case FIG. 1's optical-inspection station 14, closes a relay to connect that MR_IN to a line, MR_RTN_IN, that relay 36 keeps grounded. As a result, current flows through resistor R2 and causes a low voltage level in the MR_IN line and thus in the MR_SENSE line. The control circuit 30 is thus advised that the downstream machine is ready to receive another board. The control circuit 30 reports this, too, to the host computer over communications channel 42 if that computer has asked the control circuit 30 to report the SMEMA signal states.

If MR_SENSE is low and the control circuit 30 has been placed in a state in which the emulator is to forward the machine-ready state from the downstream machine to the upstream machine, circuit 30 asserts the MR_DRIVE signal and thereby closes a further relay 48. This connects together the MR_OUT and MR_RTN_OUT lines, which are the first two, machine-ready conductors of the upstream SMEMA cable 40 (FIG. 1). That is, it forwards to the pick-and-place machine 12 the optical-inspection station 14's message that it is ready to receive another board.

Note that the illustrated embodiment employs relays to connect the BA_RTN_IN and MR_RTN_IN signals to ground and to connect the BA_IN and MR_IN conductors to their respective pull-up resistors. Of course, relays are not needed for this purpose; those connections could be hard-wired, since they merely provide terminations for the neighboring machines' relays. But the illustrated embodiment uses relays so that it can permit pass-through connections, which the drawing omits for the sake of simplicity. The pass-through connections are switchable connections between MR_OUT and MR_IN, between MR_RTN_OUT and MR_RTN_IN, between BA_IN and BA_OUT, and between BA_RTN_IN and BA_RTN_OUT. Relays not shown make these switchable connections. In contrast to the illustrated relays, though, the relays used for the pass-through connections are "normally closed" in the sense that they complete the pass-through connections if the unit's power fails. When a power failure has thus placed the control circuit in its pass-through state, the various relays shown in FIG. 3 are all open, with the result that the emulator is essentially transparent: operation is the same as if the upstream and downstream SMEMA-enabled board-processing machines were connected to each other directly rather than through the emulator.

As was mentioned above in connection with FIG. 1, the coordination circuitry 24 bases its control of individual SMEMA-device emulators on information that it obtains from one or more circuit-board-processing machines or other emulators. The coordination circuitry's physical arrangement will undoubtedly vary widely among various of the present invention's implementations. In some cases, it may reside on a single computer or other digital device. More frequently, one or more (typically small) processors, represented in FIG. 1 by host machines 26, 52, and 54, will handle direct communications with the emulators and the circuit-board-processing machines, while a central controller, represented in FIG. 1 by block 56, exercises higher-level control by communication with the host machines. This will be a convenient arrangement when, say, the database and other applications used for overall shop control reside at some location remote from the shop floor; having host machines located on the shop floor will minimize signal-routing complexity.

Although FIG. 1 shows a plurality of host machines 26, 52, and 54 for the sake of example, it also shows all of the depicted board-processing machinery as communicating directly with a single host machine 26. This is to illustrate that a single host machine may handle communications with all or a significant number of the board-processing machines even in systems in which a central controller such as controller 56 communicates with the board-processing machinery only through other processors.

As was mentioned above, one of a number of ways in which a single host machine can communicate with a plurality of board-processing machines concurrently is to employ an Ethernet or similar shared-medium channel, exemplified by FIG. 1's channel 28. Among other possibilities is for the host machine to be provided with expansion cards that enable it to be connected over multiple channels in parallel. FIG. 1's lines 56, 58, and 60, which provide communication between host machine 24 and respective bar-code readers 62, 64, and 66, exemplify such an arrangement. They may be RS-232 channels, for example. Those bar-code readers are examples of non-SMEMA-enabled board-processing machines with which the coordination circuitry 24 may communicate.

Another communications-channel approach is to daisy-chain a number of devices. FIG. 1 illustrates this with the host machine's two SMEMA-device emulators 22 and 38. As FIG. 3 illustrates, SMEMA-device emulator 22 includes not only a communications channel 42 between emulator 22 and host machine 26 but also a communications channel 68 between emulator 22 and the next emulator 70. In the illustrated embodiment, these channels' physical layer takes the form of multi-conductor cables, exemplified by FIG. 4's cables 42 and 68, connected to the host machine's parallel port. As FIG. 4 shows, the illustrated embodiment divides seventeen of the (twenty-five-conductor) cables' conductors among address, command, and data functions. The host machine employs the address lines to identify the daisy-chained emulator to which the command on its command lines is directed. If the control circuit 30 recognizes its address on the address lines, it responds to the command.

Although the cable has seven command lines and can therefore be used to transmit any one of $2^7=128$ distinct binary-signal combinations, the illustrated system recognizes only eleven such combinations as valid commands. These are named as follows:

SET ADDRESS
STORE ADDRESS
ENTER NORMAL STATE
ENTER SHUTDOWN STATE
READ BOX STATUS
READ SMEMA STATUS
READ RELAY STATUS
OPEN RELAY1
CLOSE RELAY1
OPEN RELAY2
CLOSE RELAY2

The first two commands, namely, SET ADDRESS and STORE ADDRESS, are used during system initialization to assign addresses to the daisy-chained emulators. When the system starts up initially, the emulators are in states in which they consider themselves not to have been assigned addresses. When an emulator in this state receives the SET ADDRESS command, it treats the value on the address lines as the address that it is to assume. Also, it sends the next emulator downstream an invalid command value instead of forwarding the command value, SET ADDRESS, that it has received from its upstream neighbor. This prevents the downstream emulators from assuming the same address. Actually, the SET ADDRESS command merely prepares the emulator to assume that address. It is upon a transition to the STORE ADDRESS command that it actually stores the address-line values as the address with which it associates itself.

The host then returns the command-line values to SET ADDRESS. Now that the first emulator has assumed its own address, though, it forwards the SET ADDRESS command to the next emulator downstream instead of sending an invalid command, as it did before it had assumed an address. The next emulator downstream, having not yet assumed an address, reacts to the SET ADDRESS and STORE ADDRESS commands as its upstream neighbor did, and it thereby associates itself with a (presumably different) address. This continues until all daisy-chained emulators have been assigned respective addresses.

The next command in the list, namely, ENTER NORMAL STATE, directs the emulator to assume a state in which it merely forwards the (asserted or unasserted) board-available signal from its upstream SMEMA-channel neighbor to its downstream SMEMA-channel neighbor and forwards the (asserted or unasserted) machine-ready signal from its downstream neighbor to its upstream neighbor. The ENTER SHUTDOWN STATE causes the emulator to assume a different state, one in which it keeps its MR_DRIVE and BA_DRIVE signals unasserted, thereby keeping FIG. 3's relays 44 and 48 open, independently of the values of the signals that it receives from its upstream and downstream SMEMA-channel neighbors. In that state, FIG. 1's emulator 22 would inform the pick-and-place machine 12 that the optical-inspection station 14 is not ready to receive a board, and it would inform the optical-inspection station 14 that the pick-and-place machine 12 has no board available, even if the signals from those two machines indicated just the opposite.

The next command, READ BOX STATUS, causes the addressed emulator to is place on the data lines a code that indicates whether it is in its normal state or its shutdown state. (Actually, only three of the five "data" lines carry actual variable data; to the other two lines, the emulators apply fixed values by which they inform the host computer that at least one emulator is connected to it.)

The host computer can also use the READ BOX STATUS command to add a verification step to the initialization process. At the start of that process, the coordination circuitry normally will have been programmed with knowledge of how many emulators there are. If it has not been thus programmed, though, each assignment of a new address can be followed by a READ BOX STATUS command directed to that address. If no valid status value appears on the data lines, the coordination circuitry can conclude that there are no further emulators in the daisy chain.

The next command, READ SMEMA STATUS, requests that the addressed emulator place on the data lines a code reporting the values of the board-available and machine-ready signals that the emulator is receiving from its SMEMA neighbors.

The purposes of the remaining commands will be described below in connection with a description, to which we now turn, of exemplary control scenarios that illustrate how a system employing the present invention's teachings can continuously afford expanded control and reporting capabilities. In our first example, let us suppose that FIG. 1's optical-inspection station 14 has detected one or more improperly placed components on the board that it is currently inspecting. Machine 14 will typically have a capability for machine communication of this fact, and we are assuming that a port to the Ethernet channel 28 has been provided for this purpose. Host machine 26 will have been programmed to understand the inspection machine's communications, and it may additionally include software for making appropriate decisions in response.

In the case of the illustrated embodiment, though, we will assume that the host machine instead reports the error to the central controller 56. Now, there are a number of common types of information that many if not most board-processing machines will report, but machines from different suppliers tend to use different signals to represent the same information. To eliminate some of the problems that these differences would otherwise cause, the illustrated embodiment's host machines translate the information into a common language. Specifically, the illustrated embodiment's host machines communicate with the central controller 56 by way of Extensible Markup Language ("XML") messages that conform to document-type definitions shared for this purpose by the central controller 56 and the various host machines.

Incidentally, the benefits of thus translating machine-specific messages into a common language are not limited to arrangements in which the coordination circuitry is implemented in a plurality of machines. Even when it is implemented in a single computer, the requisite computer programming in modules that separately configure the computer as a central-control entity for overall control and one or more local-control entities for direct communication with individual emulators and/or board-processing-line machines under the central-control entity's direction. The local-control modules may have different individual programming to reflects the different types of line machines with which they direct communicate.

When host machine 26 receives from the optical-inspection station 14 the signals that represent an inspection transaction's results, the host machine translates that information into a UNITCOMPLETE message, whose document-type definition specifies a message format of the type that FIG. 5 depicts. In FIG. 5, italics represent variable data, elements enclosed in brackets can occur zero or one time, and elements enclosed in braces can be present zero or more times. As FIG. 5 indicates, the message format has many such optional elements and thus is able to contain the meanings of a wide variety of messages that various types of board-processing machines from various suppliers may generate.

Now, the message format depicted in FIG. 5 is merely exemplary, and it would unnecessarily complicate the discussion to describe all of its elements. One element to be mentioned, though, is the one that contains the unique__unit__id value. Its purpose is to identify the particular board involved, and it would be typical for a message reporting the end of a board-processing transaction to include such information. Various other fields would typically represent the board-processing machine's identifier for the particular translation involved, the transaction's start and stop times, and the type of board of which the board just processed is an instance.

In the case of a board that has failed its inspection, a message having the illustrated format would include a <NONCONFORMANCE> element, including a constituent, <SYMPTOM> element that describes a symptom of the failure. The <SYMPTOM> element would include an identifying label for the missing or improperly placed component, it may indicate that the failure was a visual-inspection failure, as opposed to, say, an electrical-shorts-test failure, and it could also include a failure message that the board-processing machine produced to describe the failure. A <DEFECT> element may also be included in the <NONCONFORMANCE> element to indicate what type of defect is associated with that symptom.

The central controller may in response conclude that, because of the thus-identified defect or possibly an accumulation of similar or related defects, the assembly line should be stopped until, say, one of the pick-and-place machine's component rolls is replaced. If it does, the central controller 56 sends to the host machine 26 a message saying that processing should be stopped at the pick-and-place machine. For this purpose, some of the invention's implementations may employ messages that specify a particular machine or machines that the emulators should specifically be used to halt. But the illustrated embodiment uses only a very simple XML message, listed by FIG. 6, that tells the host machine to perform a shut-down operation.

In response, the host machine needs to command the pick-and-place machine (and possibly others) to stop its processing. In many cases, that machine may itself include the capability of carrying out such communication. As was noted above, though, capabilities differ among machines from different manufacturers, and it may be that the particular pick-and-place machine used by the line in question does not have the capability of thus being directed to stop its operation. This is where the present invention's teachings afford an advantage. By simply directing emulator 22 to keep presenting the pick-and-place machine 12 a nonasserted machine-ready signal even though the optical-inspection station 14 is sending it an asserted machine-ready signal, the system can cause the pick-and-place machine 12 to not to accept any further boards for processing until such time as the appropriate corrective action has been taken.

Another example of the invention's use involves ensuring that all boards are identified. FIG. 1 shows bar-code readers 62, 64, and 66 as being provided at several of the board-processing machines' outlet ports. When a bar-code reader reports to host machine 26 that it has failed to read the bar code on a board whose processing its associated board-processing machine has just finished, host machine 26 can use the emulators to prevent the next machine from loading in the board until the bar-code-reading process has been completed successfully. The host machine may cause this emulator action in response to exchanges of XML messages sent by the central controller 56, or it may do so as a result of drawing its own inferences from the bar-code-reader outputs. In either event, the host machine can so control one of the emulators as to ensure that processing occurs only for boards that have been identified properly.

For example, the pick-and-place machine 12 may complete its processing of a given board and place it into an available-board bay, in which bar-code reader 62 should be able to read that board's bar code. When the pick-and-place machine has thus completed that board's processing, it will send an asserted board-available signal over SMEMA cable 40. However, the host machine 24 places the emulator 22 in a state in which the board-available signal sent by the emulator to the subsequent, optical-inspection machine 14 is instead unasserted until bar-code reader 62 reports that it has successfully read the bar code. This prevents unidentified boards from being processed.

In another example of how the invention may be used, the system ensures that machine set-up is properly completed before a product change occurs. In this example, too, the system employs the bar-code reader's output. But the system in this case additionally infers a board's type from its bar code. For example, the bar code may itself include a code for the board's type. Or the host machine may be able to infer the type from locally stored information. Alternatively, the host machine may use the XML channel to ask that the central controller draw the necessary inference from information in a central database. If the board's type differs from the board type that preceded it, it should not be fed to the next machine until that machine, which may have several board in various stages of its processing, has completed all boards currently bring processed. After the machine has been cleared if all in-process boards, it can receive the set-up information needed for the new board type.

Shop-floor personnel may then load the machines with new set-up information, or that information may pass over a non-SMEMA communications channel, such as FIG. 1's Ethernet cable 28. Such a channel could also be used to direct the board-processing machines to interrupt feeding if they have the capability for receiving such commands. If one or more do not, though, the system would employ the emulators in the manner described above. Again, by interposing SMEMA-device emulators into the SMEMA channel and controlling them on the basis of information obtained from elsewhere in the board-processing line, the system conveniently affords desired control features without costly modifications to the board-processing machines.

Although much of the present invention's advantages follow from this ability to avoid such modifications, embodiments of the invention can additionally cooperate with equipment that has been modified to provide further desired functions. Consider turntable 16, for instance. Suppose that the table is so designed that closing one set of contacts causes a motor to turn the turntable to its normal position, while closing another set causes the motor to turn it to the position in which it diverts boards to, say, a reject bin. Suppose further that the turntable is so designed that these contacts are connected to the SMEMA cable's "unused" or shield conductors. Although FIG. 3 shows relays used only for sending and receiving the board-available and machine-ready signals, another relay can be provided to connect, say, the first two unused SMEMA lines (i.e., to short FIG. 2's fifth and sixth conductors together), while a further relay could be used to connect, say, the third unused conductor to the shield conductor (i.e., to short FIG. 2's seventh and eighth conductors together).

Indeed, the command list mentioned above is based on the assumption that two such further relays are provided. The OPEN RELAY1 command causes the emulator to assume a state in which a relay connected across the first two unused SMEMA conductors is open, whereas the CLOSE RELAY1 command places the emulator in the state in which that relay is closed. OPEN RELAY2 and CLOSED RELAY2 similarly direct the emulator to open and close an emulator relay that is connected between the third unused SMEMA conductor and the SMEMA shield conductor. In the illustrated embodiment, the emulator provides a hard-wired connection from the upstream cable's "unused" shield to corresponding conductors in the downstream cable, so the illustrated emulator does not treat the upstream and downstream segments of those lines separately, as it does the upstream and downstream board-available and machine-ready lines. Of course, other embodiments may treat them separately to provide further flexibility.

As was mentioned before, control could be performed in response to, say, the optical-inspection station 14's output: the turntable would deliver the board to a defective-hoard bin if it failed that inspection but to the next processing stage, namely, the reflow machine 18, if it passed.

A similar approach can be taken to control of a wide variety of other assembly-line components. When two-sided boards have completed processing on one side, they are sometimes returned to the same line (which is then loaded with different set-up information) for processing on the other side. For this purpose, a board flipper is employed, typically somewhere upstream of the machines that FIG. 1 shows, and a bar-code reader may precede the board flipper. When the central controller 56 has received the result of the bar-code reader's inspection, it may consult its database and find that the particular board there being reported has already been processed on one side. If so, a "product change" needs to take place in order to set the system up for processing the board's other side. Here again, the system would use the emulators to ensure that the various line machines had been flushed out and set up for the new board side before the board needing opposite-side processing is advanced through the line. Furthermore, one emulator's additional relays could be employed to operate the board flipper, just as additional relays were to operate the turntable. Similar additional-relay use could be employed to control indicator lamps, annunciators, etc.

From the description so far, it can be appreciated that thus controlling emulators in response to information gathered from other line locations provides a relatively simple way of obtaining capabilities not inherent in the assembly line's board-processing machines. Emulators can also be used in the reverse fashion: information obtained from emulators can be employed as a basis for controlling board-processing machinery or other emulators.

For example, it may have been found empirically that some sequence of machines within the board-processing line tends to encounter difficulties if the number of boards occupying that sequence at a particular time exceeds some predetermined number. By monitoring the outputs the emulators at the beginning and end of the sequence, the coordination circuitry can keep track of how many boards that machine sequence currently contains and, if the number has reached the predetermined number, preventing the machine at the start of the machine sequence from accepting any further boards until a board has left the sequence. It may do this either by controlling the emulator upstream of that machine sequence, or, if the first machine in that sequence has the necessary capability, by communicating directly with that machine over a non-SMEMA channel.

Also, upstream and downstream emulators can glean cycle-time information for a machine that is not inherently capable of reporting that information. Specifically, an emulator that simply forwards the board-available and machine-ready messages between its adjacent machines can, by reporting those signals' value to the coordination circuitry, enable that circuitry to determine when the downstream board-processing machine is starting a cycle. That is, the coordination circuitry can infer that a board is being fed to that machine if simultaneous assertion of the board-available and machine-ready signals is followed by de-assertion of the machine-ready signal. When the emulator on the downstream side of the machine then reports its reception of an asserted board-available signal, the coordination circuitry can conclude that the cycle is completed. It can then time operations at other places along the line in response to such cycle timing.

From the forgoing discussion, it is apparent that the present invention can be employed in a wide range of embodiments. It thus constitutes a significant advance in the art.

What is claimed is:

1. For controlling a circuit-board-processing line that includes a plurality of circuit-board-processing-line machines, at least a plurality of the circuit-board-processing-line machines providing respective SMEMA ports and being connected in series by SMEMA channels extending between the SMEMA ports, at least one of the circuit-board-processing-line machines providing a non-SMEMA communications port separate from the SMEMA ports, a control system comprising:
   A) at least one SMEMA-device emulator providing:
      i) SMEMA ports that so interface with a respective one of the SMEMA channels as thereby to interpose that SMEMA-device emulator in that SMEMA channel and
      ii) a separate, non-SMEMA communications port, by which that SMEMA-device emulator receives signals in accordance with which it transmits signals from at least one of its SMEMA ports; and
   B) line-coordination circuitry connected in communication with at least one said SMEMA-device emulator's non-SMEMA communications port for transmission of signals thereto and in communication with at least one said circuit-board-processing-line machine's non-SMEMA communications port for reception of signals therefrom, the signals sent by the line-coordination circuitry to the SMEMA-device emulator's communications port depending on the signals received from the non-SMEMA port of at least one said circuit-board-processing-line machine.

2. A control system as defined in claim 1 wherein:
   A) the line-coordination circuitry includes a central-control entity and at least one local-control entity and provides a coordination-circuitry channel by way of which the central-control entity communicates with the at least one local-control entity; and
   B) only the at least one local-control entity receives the signals received by line-coordination circuitry from the at least one circuit-board-processing line machine's non-SMEMA communications port and sends the signals sent from the line-coordination circuitry to the SMEMA-device emulator's non-SMEMA communications port.

3. A control system as defined in claim 2 wherein the line-coordination circuitry includes:
   A) a central-control computer configured by programming to implement the central-control entity; and
   B) at least one local-control computer separate from the central-control computer and configured by programming to implement at least one said local-control entity.

4. A control system as defined in claim 2 wherein the communications over the coordination-circuitry channel between the central-control entity and the at least one local-control entity depend at least in part on the signals received by line-coordination circuitry from at least one said circuit-board-processing-line machine's non-SMEMA communications port.

5. A control system as defined in claim 2 wherein the coordination-circuitry channel is an XML channel.

6. A control system as defined in claim 1 wherein at least one said SMEMA-device emulator transmits the signals from at least one of its SMEMA ports by selectively providing continuity between the conductors of at least one conductor pair in the SMEMA channel with which its SMEMA port interfaces.

7. For controlling a circuit-board-processing line that includes a plurality of circuit-board-processing-line machines, at least a plurality of the circuit-board-processing-line machines providing respective SMEMA ports and being connected in series by SMEMA channels extending between the SMEMA ports, at least one of the circuit-board-processing-line machines providing a non-SMEMA communications port separate from the SMEMA ports, a control system comprising:
   A) at least one SMEMA-device emulator providing:
      i) SMEMA ports that so interface with a respective one of the SMEMA channels as thereby to interpose that SMEMA-device emulator in that SMEMA channel; and
      ii) a separate, non-SMEMA communications port, by which that SMEMA-device emulator sends signals that depend on the signals that it receives from at least one of its SMEMA ports; and
   B) line-coordination circuitry connected in communication with at least one said SMEMA-device emulator's non-SMEMA communications port for reception of signals therefrom and in communication with at least one said circuit-board-processing-line machine's non-SMEMA communications port for transmission of signals thereto, the signals sent by the line-coordination circuitry to the circuit-board-processing-line machine's non-SMEMA communications port depending on the signals received from the non-SMEMA communications port of at least one said SMEMA-device emulator.

8. A control system as defined in claim 7 wherein:
   A) the line-coordination circuitry includes a central-control entity and at least one local-control entity and provides a coordination-circuitry channel by way of which the central-control entity communicates with the at least one local-control entity; and B) only the at least one local-control entity receives the signals received by line-coordination circuitry from the SMEMA-device emulator's non-SMEMA communications port and sends the signals sent from the line-coordination circuitry to the at least one circuit-board-processing-line machine's non-SMEMA communications port.

9. A control system as defined in claim 8 wherein the line-coordination circuitry includes:
A) a central-control computer configured by programming to implement the central-control entity; and
B) at least one local-control computer separate from the central-control computer and configured by programming to implement at least one said local-control entity.

10. A control system as defined in claim 8 wherein the communications over the coordination-circuitry channel between the central-control entity and the at least one local-control entity depend at least in part on the signals received by line-coordination circuitry from at least one said SMEMA-device emulator's non-SMEMA communications port.

11. A control system as defined in claim 8 wherein the coordination-circuitry channel is an XML channel.

12. A control system as defined in claim 7 wherein at least one said SMEMA-device emulator transmits the signals from at least one of its SMEMA ports by selectively providing continuity between the conductors of at least one conductor pair in the SMEMA channel with which its SMEMA port interfaces.

13. For controlling a circuit-board-processing line that includes a plurality of circuit-board-processing-line machines, at least a plurality of the circuit-board-processing-line machines providing respective SMEMA ports and being connected in series by SMEMA channels extending between the SMEMA ports, a control system comprising:
A) at least first and second SMEMA-device emulators, each of which provides:
i) SMEMA ports that so interface with a respective one of the SMEMA channels as thereby to interpose that SMEMA-device emulator in that SMEMA channel; and
ii) a separate, non-SMEMA communications port, by which the first SMEMA-device emulator receives signals in accordance with which it transmits signals from at least one of its SMEMA ports and by which the second SMEMA-device emulator sends signals that depend on the signals that it receives from at least one of its SMEMA ports; and
B) line-coordination circuitry connected in communication with at least the second SMEMA-device emulator's non-SMEMA communications port for reception of signals therefrom and in communication with at least the first SMEMA-device emulator's non-SMEMA communications port for transmission of signals thereto, the signals sent by the line-coordination circuitry to the first SMEMA-device emulator's non-SMEMA communications port depending on the signals received from at least the second SMEMA-device emulator's non-SMEMA communications port.

14. A control system as defined in claim 13 wherein:
A) the line-coordination circuitry includes a central-control entity and at least one local-control entity and provides a coordination-circuitry channel by way of which the central-control entity communicates with the at least one local-control entity; and
B) only the at least one local-control entity receives the signals received by line-coordination circuitry from the second SMEMA-device emulator's non-SMEMA communications port and sends the signals sent from the line-coordination circuitry to the first SMEMA-device emulator's non-SMEMA communications port.

15. A control system as defined in claim 14 wherein the line-coordination circuitry includes:
A) a central-control computer configured by programming to implement the central-control entity; and
B) at least one local-control computer separate from the central-control computer and configured by programming to implement at least one said local-control entity.

16. A control system as defined in claim 14 wherein the communications over the coordination-circuitry channel between the central-control entity and the at least one local-control entity depend at least in part on the signals received by line-coordination circuitry from at least the second SMEMA-device emulator's non-SMEMA communications port.

17. A control system as defined in claim 14 wherein the coordination-circuitry channel is an XML channel.

18. A control system as defined in claim 13 wherein at least one said SMEMA-device emulator transmits the signals from at least one of its SMEMA ports by selectively providing continuity between the conductors of at least one conductor pair in the SMEMA channel with which its SMEMA port interfaces.

19. For controlling a circuit-board-processing line that includes a plurality of circuit-board-processing-line machines, at least a plurality of the circuit-board-processing-line machines providing respective SMEMA ports and being connected in series by SMEMA channels extending between the SMEMA ports, at least one of the circuit-board-processing-line machines providing a non-SMEMA communications port separate from the SMEMA ports, a method comprising:
A) providing at least one SMEMA-device emulator that includes:
i) SMEMA ports that so interface with a respective one of the SMEMA channels as thereby to interpose that SMEMA-device emulator in that SMEMA channel; and
ii) a separate, non-SMEMA communications port; and
B) providing line-coordination circuitry connected in communication with at least one said SMEMA-device emulator's non-SMEMA communications port and at least one said circuit-board-processing-line machine's non-SMEMA communications port;
C) employing at least one said circuit-board-processing-line machine's non-SMEMA communications port to send signals to the line-coordination circuitry;
D) employing the line-coordination circuitry to send signals that depend on the signals received from the at least one circuit-board-processing-line machine's non-SMEMA communications port to at least one said SMEMA-device emulator's non-SMEMA communications port; and
E) employing at least one said SMEMA-device emulator to send over the SMEMA channel with which its SMEMA ports interface signals that depend on the signals received at the non-SMEMA communications port thereof from the line-coordination circuitry.

20. A method as defined in claim 19 wherein:
A) the line-coordination circuitry includes a central-control entity and at least one local-control entity and provides a coordination-circuitry channel by way of which the central-control entity communicates with the at least one local-control entity; and
B) only the at least one local-control entity receives-the signals received by line-coordination circuitry from the at least one circuit-board-processing-line machine's non-SMEMA communications port and sends the signals sent from the line-coordination circuitry to the SMEMA-device emulator's non-SMEMA communications port.

21. A method as defined in claim 20 wherein the line-coordination circuitry includes:
A) a central-control computer configured by programming to implement the central-control entity; and
B) at least one local-control computer separate from the central-control computer and configured by programming to implement at least one said local-control entity.

22. A method as defined in claim 20 wherein the communications over the coordination-circuitry channel between the central-control entity and the at least one local-control entity depend at least in part on the signals received by line-coordination circuitry from at least one said circuit-board-processing-line machine's non-SMEMA communications port.

23. A method as defined in claim 20 wherein the coordination-circuitry channel is an XML channel.

24. A method as defined in claim 19 wherein at least one said SMEMA-device emulator transmits the signals from at least one of its SMEMA ports by selectively providing continuity between the conductors of at least one conductor pair in the SMEMA channel with which its SMEMA port interfaces.

25. For controlling a circuit-board-processing line that includes a plurality of circuit-board-processing-line machines, at least a plurality of the circuit-board-processing-line machines providing respective SMEMA ports and being connected in series by SMEMA channels extending between the SMEMA ports, at least one of the circuit-board-processing-line machines providing a non-SMEMA communications port separate from the SMEMA ports, a method comprising:
A) providing at least one SMEMA-device emulator that includes:
  i) SMEMA ports that so interface with a respective one of the SMEMA channels as thereby to interpose that SMEMA-device emulator in that SMEMA channel; and
  ii) a separate, non-SMEMA communications port; and
B) providing line-coordination circuitry connected in communication with at least one said SMEMA-device emulator's non-SMEMA communications port and at least one said circuit-board-processing-line machine's non-SMEMA communications port;
C) employing at least one said SMEMA-device emulator's non-SMEMA communications port to send signals to the line-coordination circuitry; and
D) employing the line-coordination circuitry to send signals that depend on the signals received from the at least one SMEMA-device emulator's non-SMEMA communications port to at least one said circuit-board-processing-line machine's non-SMEMA communications port.

26. A method as defined in claim 25 wherein:
A) the line-coordination circuitry includes a central-control entity and at least one local-control entity and provides a coordination-circuitry channel by way of which the central-control entity communicates with the at least one local-control entity; and
B) only the at least one local-control entity receives the signals received by line-coordination circuitry from the SMEMA-device emulator's non-SMEMA communications port and sends the signals sent from the line-coordination circuitry to the at least one circuit-board-processing-line machine's non-SMEMA communications port.

27. A method as defined in claim 26 wherein the line-coordination circuitry includes:
A) a central-control computer configured by programming to implement the central-control entity; and
B) at least one local-control computer separate from the central-control computer and configured by programming to implement at least one said local-control entity.

28. A method as defined in claim 26 wherein the communications over the coordination-circuitry channel between the central-control entity and the at least one local-control entity depend at least in part on the signals received by line-coordination circuitry from at least one said SMEMA-device emulator's non-SMEMA communications port.

29. A method as defined in claim 26 wherein the coordination-circuitry channel is an XML channel.

30. A method as defined in claim 25 wherein at least one said SMEMA-device emulator transmits the signals from at least one of its SMEMA ports by selectively providing continuity between the conductors of at least one conductor pair in the SMEMA channel with which its SMEMA port interfaces.

31. For controlling a circuit-board-processing line that includes a plurality of circuit-board-processing-line machines, at least a plurality of the circuit-board-processing-line machines providing respective SMEMA ports and being connected in series by SMEMA channels extending between the SMEMA ports, a method comprising:
A) providing at least first and second SMEMA-device emulator, each of which includes:
  i) SMEMA ports that so interface with a respective one of the SMEMA channels as thereby to interpose that SMEMA-device emulator in that SMEMA channel; and
  ii) a separate, non-SMEMA communications port; and
B) providing line-coordination circuitry connected in communication with at least the first and second SMEMA-device emulators' non-SMEMA communications ports;
C) employing at least the second said circuit-board-processing-line machine's non-SMEMA communications port to send signals to the line-coordination circuitry that depend on the signals that it receives from at least one of its SMEMA ports;
D) employing the line-coordination circuitry to send signals that depend at least on the signals received from the second SMEMA-device emulator's non-SMEMA communications port to at least the first SMEMA-device emulator's non-SMEMA communications port; and
E) employing at least the first SMEMA-device emulator to send over the SMEMA channel with which its SMEMA ports interface signals that depend at least on the signals received at its non-SMEMA communications port from the line-coordination circuitry.

32. A method as defined in claim 31 wherein:

A) the line-coordination circuitry includes a central-control entity and at least one local-control entity and provides a coordination-circuitry channel by way of which the central-control entity communicates with the at least one local-control entity; and B) only the at least one local-control entity receives the signals received by line-coordination circuitry from the second SMEMA-device emulator's non-SMEMA communications port and sends the signals sent from the line-coordination circuitry to the first SMEMA-device emulator's non-SMEMA communications port.

33. A method as defined in claim 32 wherein the line-coordination circuitry includes:

A) a central-control computer configured by programming to implement-the central-control entity; and B) at least one local-control computer separate from the central-control computer and configured by programming to implement at least one said local-control entity.

34. A method as defined in claim 32 wherein the communications over the coordination-circuitry channel between the central-control entity and the at least one local-control entity depend at least in part on the signals received by line-coordination circuitry from at least the second SMEMA-device emulator's non-SMEMA communications port.

35. A method as defined in claim 32 wherein the coordination-circuitry channel is an XML channel.

36. A method as defined in claim 31 wherein at least one said SMEMA-device emulator transmits the signals from at least one of its SMEMA ports by selectively providing continuity between the conductors of at least one conductor pair in the SMEMA channel with which its SMEMA port interfaces.

\* \* \* \* \*